(12) United States Patent
Okamoto et al.

(10) Patent No.: US 7,414,909 B2
(45) Date of Patent: Aug. 19, 2008

(54) NONVOLATILE SEMICONDUCTOR MEMORY

(75) Inventors: Kazuyoshi Okamoto, Tokyo (JP); Kazumasa Yanagisawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 70 days.

(21) Appl. No.: 11/606,025

(22) Filed: Nov. 30, 2006

(65) Prior Publication Data

US 2007/0127302 A1 Jun. 7, 2007

(30) Foreign Application Priority Data

Dec. 6, 2005 (JP) ............................. 2005-352384

(51) Int. Cl.
*G11C 7/02* (2006.01)
(52) U.S. Cl. .................. 365/210; 365/185.29; 365/104
(58) Field of Classification Search ................ 365/210, 365/185.29, 104, 63, 72, 185.11, 185.2
See application file for complete search history.

(56) References Cited

U.S. PATENT DOCUMENTS

| 6,307,780 | B1 | 10/2001 | Tanaka et al. | |
| 7,102,926 | B2 * | 9/2006 | Lee et al. ................ | 365/185.11 |
| 2006/0083072 | A1* | 4/2006 | Umezawa ............... | 365/185.29 |

FOREIGN PATENT DOCUMENTS

| JP | 07-211086 A | 8/1995 |
| JP | 9-8255 A | 1/1997 |
| JP | 11-191298 A | 7/1999 |
| JP | 2001-203331 A | 7/2001 |
| JP | 2001-358235 A | 12/2001 |

* cited by examiner

*Primary Examiner*—Dang T Nguyen
(74) *Attorney, Agent, or Firm*—Miles & Stockbridge P.C.

(57) ABSTRACT

There is provided a high-density mask ROM operable at a high speed. With the mask ROM, respective source lines are disposed so as to be shared by memory cells in respective columns adjacent to each other, and bit lines are disposed so as to correspond to the respective columns of the memory cells. Further, the dummy cells are disposed for the respective columns of the memory cells. The dummy cells are each made up of a series-circuit including a first switching transistor that is turned into the conducting state in response to a signal potential on a dummy word line (DWL), and a second switching transistor 17 for coupling an adjacent source line to the bit line corresponding thereto in response to a potential of the source line in a column corresponding thereto. The memory cells each are made up of one unit of a transistor and a data storage formed by mask wiring. At the time of reading data, a potential of the source line in a select column is caused to undergo a change, whereupon there occurs a potential difference between a pair made up of the bit line as selected to which the memory cells as selected are coupled, and a reference bit line with the dummy cells coupled thereto, so that it is possible to execute readout of data by detecting the potential difference.

9 Claims, 5 Drawing Sheets

:17 MAY BE ALWAYS TURNED ON

NONVOLATILE SEMICONDUCTOR MEMORY

CROSS-REFERENCE TO RELATED APPLICATION

The present application claims priority from Japanese patent application No. 2005-352384 filed on Dec. 6, 2005, the content of which is hereby incorporated by reference into this application.

BACKGROUND OF THE INVENTION

The invention relates to a nonvolatile semiconductor memory, and in particular, is concerned with a configuration of a mask ROM (Read Only Memory) wherein stored data is programmable by mask wiring.

With the mask ROM, data is fixedly stored by selectively forming metal interconnections in a storage with the use of a mask for a wiring pattern during a manufacturing process. The mask ROM includes a NAND type mask ROM, or a NOR type mask ROM, depending on a configuration of interconnection among memory cells. With the NAND type mask ROM, a plurality of memory cells are connected in series to each other between a bit line and a source line. Further, as is so often the case, data is stored by adjusting the threshold voltages of respective transistors of the memory cells through implantation of a dopant, thereby setting the respective transistors to an enhancement mode or a depletion mode.

With the NOR type mask ROM, one memory cell interconnects a bit line, and a source line. The one memory cell has a configuration wherein data is fixedly stored by selectively forming an interconnection between a transistor and the source line or the bit line by mask wiring, or a configuration wherein stored data is fixedly programmed by adjusting the threshold voltage of a memory cell transistor through implantation of a dopant, thereby setting the transistor to the enhancement mode or the depletion mode.

In the case of either the NAND type mask ROM, or the NOR type mask ROM, a word line is driven into a select state, and readout of data is executed according to magnitude of an electric current flowing between the bit line and the source line. That is, a select memory cell is disposed between the bit line and the source line, and the readout of the data is executed according to the magnitude of the electric current flowing between the bit line and the source line at the time when the word line corresponding thereto is selected. The bit lines are normally precharged to a predetermined voltage level, and readout of the data is executed according to magnitude of a change in bit line voltage, from a pre-charge voltage, at the time of selection of the memory cell. There have been proposed various configurations for the mask ROM in order to execute quick and stable readout of data.

With the NOR type mask ROM, use is normally made of a configuration of 1-cell/bit wherein 1-bit data is stored in one memory cell to meet demands for high-density while use is generally made of a configuration of 2-cells/bit wherein 1-bit data is stored in two memory cells to meet demands for high-speed.

Patent Document 1 (Japanese Unexamined Patent Publication No. Hei 9 (1997)-8255) has disclosed a configuration of a NAND type ROM wherein a distance between a source line and a ground line in a memory cell is kept constant regardless of a position of a select memory cell, inside a memory cell array, thereby attempting to achieve improvement on noise margin at the time of reading data. In Patent Document 1, as for a bit line in a select column, utilized as a source line for memory cells in an adjacent column, a memory cell current is caused to flow to a bit line in the adjacent column by a pre-charge current. Bit lines at symmetrical positions in the memory cell array are connected to dummy cells disposed outside the memory cell array, respectively, to thereby generate a reference current, and the memory cell current, and the reference current are subjected to differential amplification by a sense amplifier. With Patent Document 1, an attempt is made to keep source line resistance of the respective memory cells constant regardless of positions of the select columns, inside the memory cell array, by utilizing the bit line adjacent to a select bit line as the source line.

In Patent Document 2 (Japanese Unexamined Patent Publication No. 2001-203331), there is shown a ROM of a hierarchical bit line configuration, wherein a dummy cell is disposed at opposite ends of main bit lines in pairs, respectively, thereby differentially reading current changes of the main bit lines in pairs, respectively. With the adoption of the hierarchical bit line configuration, implementation of quick readout is attempted by reducing the number of memory cells connected to sub-bit lines, respectively, to accordingly reduce parasitic capacitances of the main/sub-bit lines, respectively. The dummy cells are each kept in the non-conducting state at all times, functioning as parasitic capacitance. A memory cell transistor is set to an enhancement mode or a depletion mode according to stored data, and data is read by differentially amplifying respective potentials of the main sub-bit lines, generated due to a current fed from a current supply source, flowing via a select memory cell, and respective potentials of reference main sub-bit lines.

In Patent Document 3 (Japanese Unexamined Patent Publication No. 2001-358235), there has been disclosed a ROM of a hierarchical bit line configuration, as with the case of Patent Document 2, wherein dummy cells connected to main bit lines are each made up of a MOS transistor (an insulated gate field effect transistor) with a source and a drain, mutually connected to each other. By so doing, parasitic capacitance of the dummy cell, for a bit line, is created by source junction capacitance and drain junction capacitance, and is rendered twice as large as parasitic capacitance of the memory cell, thereby reducing the number of the dummy cells in an attempt to attain higher density of the memory cells in a memory cell array.

In Patent Document 4 (Japanese Unexamined Patent Publication No. Hei 11 (1999)-191298), there has been disclosed a ROM of a hierarchical bit line configuration, wherein a sub-bit line is provided with a transistor for discharging in order to speed up readout of data, and the conducting state/non conducting state of the transistor for discharging is controlled by use of an inverting signal of a control signal for a block select gate transistor disposed between the sub-bit line, and a main bit line. With Patent Document 4, a read-cycle time is shortened by discharging the sub-bit lines at a higher speed, thereby attempting to speed up the readout of data. At the time of reading data, potentials of select main/sub-bit lines are differentially amplified with the use of unselect main/sub-bit lines serving as reference bit lines.

In Patent Document 5 (Japanese Unexamined Patent Publication No. Hei 7 (1995)-211086), there has been disclosed an array division structure for dividing a memory cell array into two arrays, wherein a word line driver is disposed between the arrays, a memory cell is selected in the array selected, and a memory cell current is detected by a sense amplifier while in the array unselected, a bit line is coupled to a sense amplifier corresponding thereto, and by the agency of an output signal thereof, timing for reading data is determined. A word line is in unselect state in the array unselected, and a bit line load remains constant regardless of stored data of the memory cell, so that a bit line charge speed becomes constant, which is utilized in this case.

[Patent Document 1] Japanese Unexamined Patent Publication No. Hei 9 (1997)-8255
[Patent Document 2] Japanese Unexamined Patent Publication No. 2001-203331
[Patent Document 3] Japanese Unexamined Patent Publication No. 2001-358235
[Patent Document 4] Japanese Unexamined Patent Publication No. Hei 11 (1999)-191298
[Patent Document 5] Japanese Unexamined Patent Publication No. Hei 7 (1995)-211086

SUMMARY OF THE INVENTION

Since a memory element configuration for storing 1-bit data of a mask ROM of a high-density specification differs from that of a mask ROM of a high-speed specification, those mask ROMs are individually manufactured. With the ROM of the high-density specification, as readout of data is executed according to a current drive amount of one memory cell, a data read speed is determined by a potential-change speed of a bit line, that is, the current drive amount of the memory cell, so that the ROM of the high-density specification cannot be adopted for application at a high speed although it can be adopted to application at a low speed. For reading data at a higher speed in the mask ROM of the configuration of 1-cell/bit, it is conceivable to adopt a differential configuration whereby use is made of a reference potential, and the reference potential is compared with a readout potential of a memory cell. In this case, however, the dummy memory cells for generating the reference potential needs to be connected to a reference bit line, and the reference bit line needs to be additionally disposed, resulting in an increase in layout area of the memory cell array.

On the other hand, with the mask ROM of the high-speed specification, a unit cell of the configuration of 2-cells/bit is made use of, complementary data is stored in memory cells, respectively, and a differential current/potential are generated, thereby executing readout at a high speed. Accordingly, with the mask ROM of the high-speed specification, it is possible to implement quick access substantially equivalent to that for an SRAM (Static Random Access Memory), however, since two memory cells are used for storing 1-bit data, there arises a problem of an increase in area occupied by a memory cell array.

With the configuration shown in Patent Document 1, the bit line is utilized as the source line for the memory cells in the adjacent column. Accordingly, there arises the need for changing the position of the bit line within the array, thereby causing a problem in that a wiring layout becomes complex. Further, to enable the bit line to double as the source line, advantage is taken of a memory cell layout unique to a NAND type memory cell structure, that is, a configuration wherein a memory cell block is coupled to the bit line and the source line via a block select gate, respectively, and such a configuration as described above is not applicable to a NOR type memory cell structure. Furthermore, the bit line with the memory cells connected thereto is utilized as the reference bit line, however, as the dummy cells connected to the reference bit line is disposed outside the memory cell array, there arises a problem of difficulty in reducing an array layout area.

Patent Document 2 is predicated on the hierarchical bit line configuration, and no consideration has been given to a nonhierarchical bit line configuration. Further, in order to make use of the reference bit line, there is the need for differentiating between the main bit line in a select column and the main bit line in an unselect column, thereby causing a problem of an increase in complexity in controlling connections between the respective dummy cells and the reference bit line. Further, the dummy cells are each normally in the non-conducting state, functioning only as load capacitance, for the reference bit line, and it is difficult to apply a configuration wherein the respective memory cells in a plurality of rows are connected to the bit line to the nonhierarchical bit line configuration. Furthermore, there is the need for disposing a dummy sub-bit line for exclusive use in connecting the respective dummy cells thereto, which interferes with reduction in the array area.

With the configuration shown in Patent Document 3, an attempt is made to reduce load capacitance coupled to a dummy cell bit line (reference bit line) to ½ of load capacitance coupled to the bit line, however, since Patent Document 3 is predicated on the hierarchical bit line configuration as with Patent Document 2, it is difficult to apply the configuration shown in Patent Document 3 to the nonhierarchical bit line configuration, posing the same problem as that for Patent Document 2.

With the configuration shown in Patent Document 4, it is intended that the sub-bit line is discharged at a higher speed, however, the present configuration is predicated on the hierarchical bit line configuration, and is therefore not applicable to the nonhierarchical bit line configuration as with Patent Documents 2, 3.

Further, with the configurations shown in Patent Documents 2 to 4, respectively, the source lines are coupled to a ground node in common, and no consideration is given to a distribution of potentials of the source lines owing to interconnection resistance.

With the configuration shown in Patent Document 5, it is intended that the timing for reading data even in the array unselected is set simply by activating the sense amplifier, and Patent Document 5 is predicated on the divided memory cell array structure, so that the configuration shown in Patent Document 5 is not applicable to an undivided memory cell array structure.

It is therefore an object of the invention to provide a nonvolatile semiconductor memory of high density, and accessible at a high speed.

Another object of the invention is to provide a NOR type mask ROM having a high-density memory cell layout, capable of stably reading data at a high speed.

Now, a nonvolatile semiconductor memory according to one aspect of the invention includes a plurality of memory cells arranged in a matrix fashion, the respective memory cells including a cell select transistor and a data storage, connected in series with each other, and a plurality of bit lines disposed so as to correspond to respective columns of the memory cells, the respective bit lines being connected to the memory cells in columns corresponding thereto. The plural bit lines are laid out such that the respective bit lines in columns adjacent to each other form a bit line pair.

The nonvolatile semiconductor memory according to the invention further includes a plurality of source lines disposed so as to correspond to the respective columns of the memory cells such that the respective source lines are shared by the memory cells in columns adjacent to each other. The respective columns of the memory cells, sharing the respective source lines, are connected to the respective bit lines of the individual bit line pairs.

The nonvolatile semiconductor memory according to the invention still further includes a plurality of word lines disposed so as to correspond to respective rows of the memory cells, the respective word lines being connected to the respective cell select transistors of the memory cells in rows corresponding thereto. At the time of selection of the word line, a current is caused to selectively flow between the bit line and the source line, corresponding thereto, in the respective memory cells corresponding thereto, according to stored data in the data storage.

The nonvolatile semiconductor memory according to the invention yet further includes at least one dummy word line laid out so as to be in parallel with the word lines, and a plurality of dummy cells disposed so as to correspond to the at least one dummy word line, and the respective bit lines. The respective dummy cells include a series-circuit made up of at least a first switching transistor, and a second switching transistor. The first switching transistor is turned into a conducting state at the time of selection of the dummy word line corresponding thereto while the second switching transistor is turned into the conducting state at the time of nonselection of the source line in a column corresponding thereto or at all times. When both the first and second switching transistors are in the conducting state, there is formed a path through which a current flows between the source line adjacent to the source line corresponding thereto, and the bit line corresponding thereto.

With the nonvolatile semiconductor memory according to the invention, the dummy cells are laid out so as to be lined up with respective memory cell columns, and the respective memory cell columns and the dummy cells are coupled to the respective bit lines. At the time of selection of the dummy cell, the source line in a column adjacent thereto is coupled to the bit line corresponding thereto. Accordingly, when the source line in the adjacent column is in a select state, a current flows to the bit line coupled to the dummy cell via the first and second switching transistors, thereby causing a potential change to occur to the bit line corresponding to the source line. Meanwhile, with the respective memory cells coupled to the source line in the select column, a current flows selectively via the cell select transistor, and the data storage. In consequence, there occurs a difference in potential-change speed between the bit line with the dummy cells coupled thereto, and the bit line with the memory cells coupled thereto, so that by detecting a potential difference between those bit lines as a pair, it is possible to execute quick readout of data.

In this case, the memory cells each are made up of one unit of the cell select transistor, and one unit of the data storage, and have the configuration of 1-cell/bit, so that quick readout of data can be executed without causing an increase in the layout area of the memory cell array.

Further, since the potential difference is detected by use of the bit lines forming the pair, there is no need for generating the reference potential/current by use of the reference bit line with the dummy cells connected thereto, so that it is possible to restrain an increase in the area of the memory cell array, thereby implementing a high-density nonvolatile semiconductor memory accessible at a high speed.

DETAILED DESCRIPTION OF THE PREFERRED EMBODIMENTS

Embodiment 1

Figure 1:
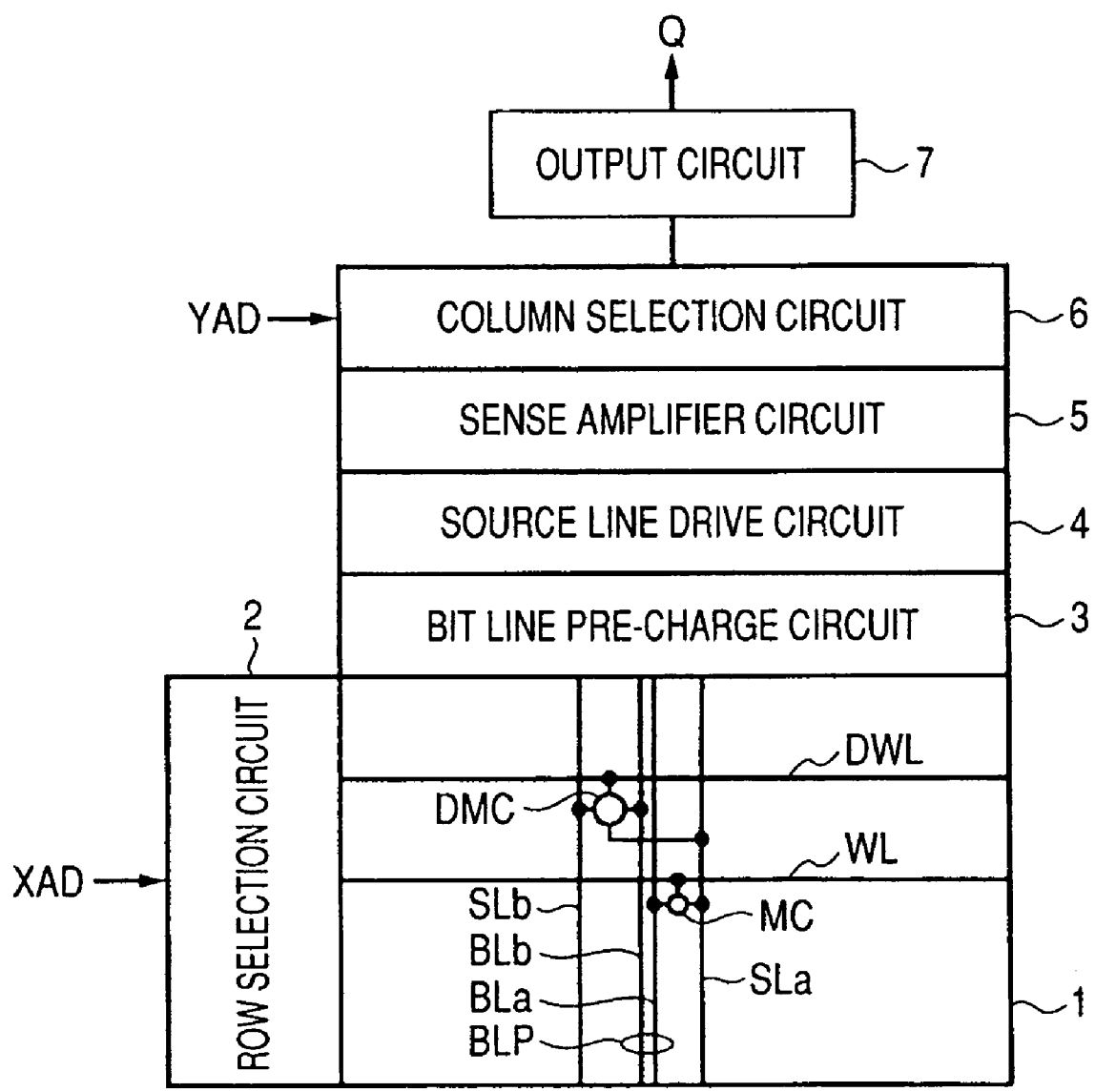
FIG. 1 is a view broadly showing a whole configuration of Embodiment 1 of a nonvolatile semiconductor memory according to the invention.

FIG. 1 is a view broadly showing a whole configuration of Embodiment 1 of a nonvolatile semiconductor memory according to the invention. In FIG. 1, the nonvolatile semiconductor memory includes a memory cell array 1 where nonvolatile memory cells MC are arranged in a matrix fashion. With the nonvolatile memory cell MC, stored data thereof is set by mask wiring.

In the memory cell array 1, word lines WL are laid out so as to correspond to respective rows of the memory cells MC, and further, bit lines BL are laid out so as to correspond to respective columns of the memory cells MC. The bit lines are laid out so as to form a pair, respectively, and in FIG. 1, there is shown a bit line pair BLP formed by the bit lines BLa, and BLb, as a typical bit line pair.

Further, in the memory cell array 1, there are provided dummy cells DMC disposed so as to be lined up in at least one row, and dummy word lines DWL coupled to the dummy cells DMC, disposed so as to be lined up in a row direction. The dummy cell DMC is provided for the respective columns of the memory cells MC, and the memory cell MC and the dummy cell DMC are connected to the bit lines, forming the bit line pair BLP, respectively. In the memory cell array 1, the memory cells are arranged in a NOR type fashion, so that the nonvolatile semiconductor memory according to Embodiment 1 of the invention is a NOR type mask ROM.

Further, in the memory cell array 1, there are further disposed source lines (SLa, SLb) so as to correspond to the bit line pair BLP. The memory cell MC, and the dummy cell DMC are connected to the bit line and the source line, corresponding thereto, respectively, and the memory cell MC causes a current to flow between the bit line and the source line, corresponding thereto, respectively, according to a potential of the word line corresponding thereto. The dummy cell DMC is selectively turned into the conducting state according to the potential of the word line corresponding thereto, and a potential of an adjacent source line, and the dummy cell DMC has a resistance value about twice as large as that for the memory cell in the conducting state, or a current drive speed ½ times as high as that for the memory cell in the conducting state, thereby generating a reference current at the time of reading data.

In FIG. 1, the memory cell MC responds to a potential of the word line WL, and selectively couples the bit line BLa to the source line SLa according to the stored data. The dummy cell DMC couples the source line SLa to the bit line BLb at a time when the dummy word line DWL is selected and the source line SLb is in an unselect state. By detecting a potential difference between respective potentials of the bit line BLa, and the bit line BLb, readout of data is executed.

The nonvolatile semiconductor memory according to the invention further includes a bit line pre-charge circuit 3 for pre-charging the bit lines BLa, and BLb to a predetermined voltage (for example, to a power supply voltage level), respectively, in a standby state, a source line drive circuit 4 for driving a source line corresponding to a select column into the select state, a sense amplifier circuit 5 for differentially amplifying a potential of a bit line pair in the select column at the time of reading data, a column selection circuit 6 for selecting a column whose address in the memory cell array 1 is designated by the agency of a column address signal YAD, an output circuit 7 for externally outputting data in a column selected by the column selection circuit 6, and a row selection circuit 2 for driving the word line WL in a row whose address in the memory cell array 1 is designated by the agency of a row address signal XAD into the select state, in parallel with the dummy word line DWL disposed so as to correspond to the word line WL.

The dummy word line DWL and the word line WL are driven into the select state in parallel with each other, and the dummy cell DMC and the memory cell MC are selected in parallel with each other, thereby causing a potential difference to occur between the bit lines BLa, and BLb.

Figure 2:
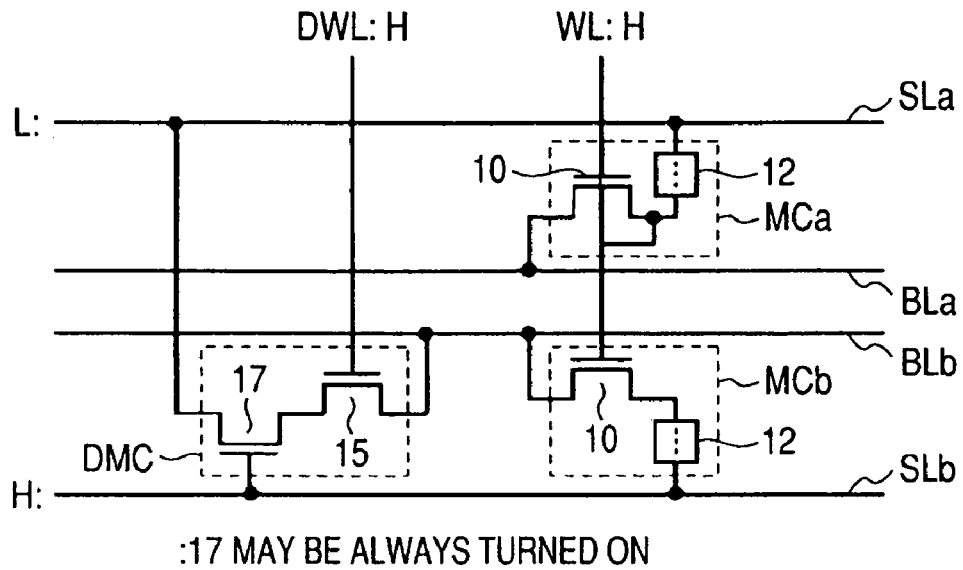
FIG. 2 is a view showing a basic configuration of the nonvolatile semiconductor memory according to Embodiment 1 of the invention at the time of reading data.

FIG. 2 is a simplified view showing a configuration and connection mode of the memory cells MC, and the dummy cell DMC, in the memory cell array 1 shown in FIG. 1. In FIG. 2, the memory cells MCa, MCb each include a data storage 12 where data is stored by mask wiring, and so forth, and a cell select transistor 10 for selectively coupling the data storage 12 to the bit line BLa, or BLb, corresponding thereto, in response to the potential of a signal on the word line WL. The cell select transistor 10 is made up of, for example, an N-channel MOS transistor, and a substrate region thereof is mutually connected with a source region thereof, thereby fixedly setting the source region of the cell select transistor 10.

The data storage 12 is set to either an electrically conducting state (an interconnection forming state) or an electrical cutoff state (an interconnection non-forming state) by mask wiring, and at a time when the data storage 12 is in the electrically conducting state, a source node of the cell select transistor 10 is connected to either the source line SLa or the source line SLb.

The dummy cell DMC includes a first switching transistor 15 and a second switching transistor 17 connected in series with each other. The first switching transistor 15 is selectively turned into the conducting state in response to the potential of a signal on the dummy word line DWL while the second switching transistor 17 is selectively turned into the conducting state in response to a potential of the source line SLb in a column corresponding thereto, and when the second switching transistor 17 is in the conducting state, a potential of the source line SLa in an adjacent column is transmitted. The first and second switching transistors 15, 17 are connected in series with each other between the bit line BLb and the source line SLb, and when both the first and second switching transistors are in the conducting state, a path through which a current flows is formed between the bit line BLb and the source line SLa. The first and second switching transistors 15, 17 each have the same transistor characteristic as that for the cell select transistor 10 (Those are all manufactured so as to be in the same size by the same manufacturing process).

The bit lines BLa, BLb, and the source lines SLa, SLb are precharged to the H-level during standby state. At the time of reading data, the dummy word line DWL and the word line WL are driven into the select state (the H-level) in parallel with each other. In each of the memory cells MC, the cell select transistor 10 is turned into the ON state, and in the dummy cell DMC, the first switching transistor 15 is turned into the ON state.

Further, the source line SLa, to which the memory cell MCa as selected is connected, is driven to the L-level of the select state. Meanwhile, the source line SLb is provided so as to correspond to an unselect column, and is maintained at the H-level. Accordingly, the second switching transistor 17 of the dummy cell DMC is turned into the ON state, and a pre-charge voltage of the bit line BLb is discharged via the first and second switching transistors 15, 17, whereupon the potential of the bit line BLb is lowered.

Meanwhile, the bit line BLa is selectively discharged according to the conducting state/the cutoff state of the data storage 12 of the memory cell MCa. More specifically, if the data storage 12 of the memory cell MCa is set to the electrically conducting state, discharging from the bit line BLa to the source line SLa is made via the cell select transistor 10, thereby lowering the potential level of the bit line BLa. At the time of this discharging operation, the bit line BLa is discharged via one unit of the cell select transistor 10 while, in the dummy cell DMC, discharging is effected via two MOS transistors connected in series (the first and second switching transistors 15, 17). Accordingly, resistance (channel resistance) between the bit line BLa and the source line SLa via the memory cell MCa is smaller than resistance (channel resistance) between the bit line BLb and the source line SLa, so that the bit line BLa is discharged at a higher speed than the bit line BLb when the data storage 12 is in the electrically conducting state, thereby generating a potential difference between the bit lines BLa and BLb.

On the other hand, when the data storage 12 of the memory cell MCa is in the electrical cutoff state, the bit line BLa is electrically isolated from the source line SLa even if the cell select transistor 10 is turned into the ON state, so that the bit line BLa maintains a pre-charge voltage level. Accordingly, the bit line BLb with the dummy cell DMC connected thereto comes to have a potential equivalent to an intermediate potential between the respective potentials of the bit line BLa and the bit line BLb, corresponding to the stored data of the memory cell MC, and by amplifying the respective potentials of the bit line BLa and the bit line BLb with the use of differential amplifiers included in the sense amplifier circuit 5 (refer to FIG. 1), the readout of data can be executed.

At the time of reading data of the memory cell MCa, the cell select transistor 10 in the memory cell MCb as well is turned into the ON state. If the data storage 12 of the memory cell MCb is set to the electrically conducting state, the cell select transistor 10 of the memory cell MCb is coupled to the source line SLb. However, with the cell select transistor 10, the substrate region, and the source region are joined with each other, and the source thereof is coupled to the source line SLb. The source line SLb in the unselect column is at the H-level, which is the same level of potential as that for the potential of the word line WL as selected, and as the cell select transistor 10 of the memory cell MCb is made up of an n-channel MOS transistor, a gate potential becomes equal to a source potential, thereby maintaining the nonconducting state (In FIG. 2, connection between a back gate and the source of the memory cell MCb is not shown). Hence, the dummy cell DMC can cause a potential change to occur to the bit line BLb with precision.

At the time of reading data of the memory cell MCb, another dummy cell (not shown) is coupled to the bit line BLa, thereby discharging the bit line BLa at an intermediate speed.

Further, for a configuration where the source region of the cell select transistor 10 of the memory cell (the memory cell MCa as well as the memory cell MCb) is fixedly set, use may be made of, for example, a configuration where a drain region is formed asymmetrically with the source region or a configuration where impurity concentration is varied.

Further, in the foregoing description, the second switching transistor 17 of the dummy cell is coupled to the source line in a column corresponding thereto. However, the gate of the second switching transistor 17 may be coupled to, for example, a power supply line so as to be normally in the conducting state. For example, when the source line SLa in a select column is driven to the L-level, a reference current is caused to occur to a reference bit line BLb in a corresponding column, and when the source line SLa in an adjacent column is in an unselect state, the source line SLa unselected is at the H-level, so that the source of the second switching transistor 17 is at the same potential as that for the gate thereof, thereby maintaining the nonconducting state. Accordingly, no current flows to the bit line BLa in this state even if the dummy word line is driven into the select state, and accurate readout of data is executed in another select column.

By coupling the gate of the second switching transistor 17 to the power supply line, a wiring layout is no longer subjected to constraints imposed by the source lines, so that the wiring layout comes to have greater flexibility, and is provided with greater ease.

With the dummy cell DMC, use is made of the series-circuit made up of the first and second switching transistors 15, 17. However, the number of the switching transistors connected in series with each other within the dummy cell DMC is not limited to two units, but use may be made of a series-circuit made up of not less than three units of the switching transistors according to a reference potential at the time of sensing. Further, when there occurs a problem of localized variation in impurity implantation as progress toward miniaturization of transistors advances, and a current driving power or a resistance value of the switching transistors undergoes variation, it is possible to stably generate an optimum reference potential by utilizing a connection configuration such as use of a plurality of switching transistors connected in series, use of parallel-connection of series-circuits, and so forth. Thus, with the dummy cell DMC, the configuration thereof is not limited to the series-circuit made up of the first and second switching transistors 15, 17, simpler in configuration and smaller in occupied area, but other connection configurations can be utilized.

Figure 3:
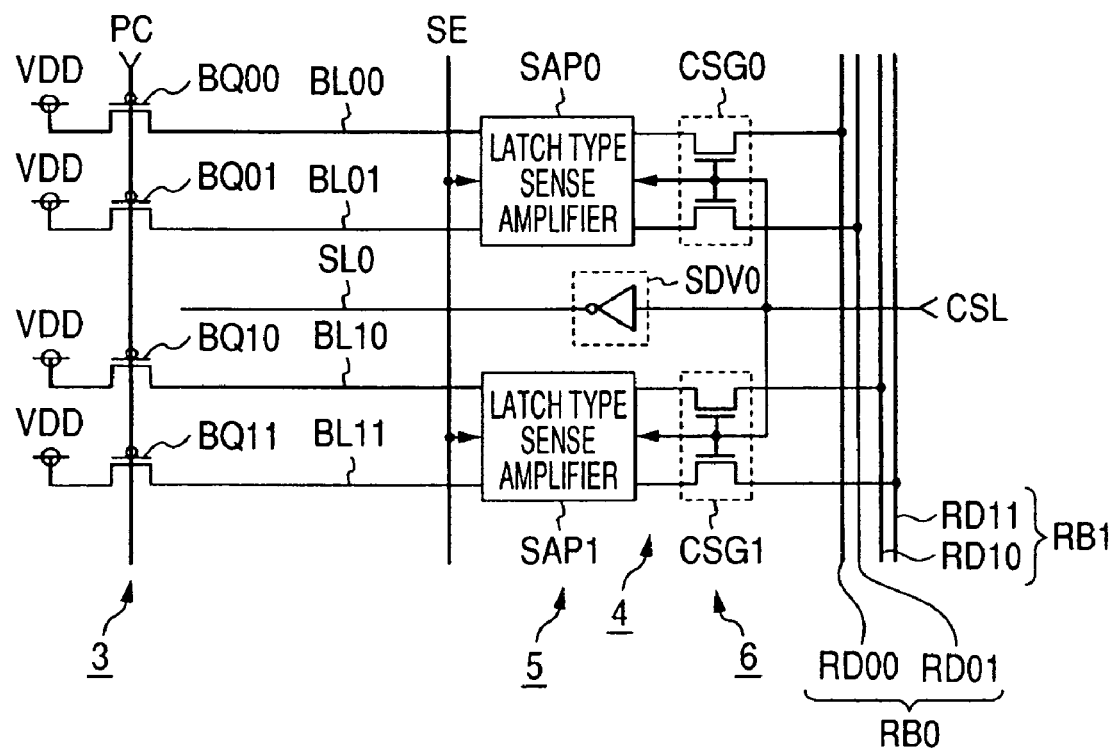
FIG. 3 is a view broadly showing a configuration of peripheral circuits around the nonvolatile semiconductor memory according to Embodiment 1 of the invention by way of example.

FIG. 3 is a view broadly showing a configuration of peripheral circuits around the memory cell array 1 shown in FIG. 1, namely, the bit line pre-charge circuit 3, source line drive circuit 4, sense amplifier circuit 5, and column selection circuit 6, by way of example.

In FIG. 3, the bit line pre-charge circuit 3 is provided so as to correspond to bit lines BL00, BL01, BL10, and BL11, respectively, including pre-charge transistors BQ00, BQ01, BQ10, and BQ11, to be turned into the conducting state, respectively, according to a pre-charge indicator signal PC. The pre-charge transistors BQ00, BQ01, BQ10, and BQ11 are each made up of a P-channel MOS transistor (an insulated gate FET), transmitting a power supply voltage VDD to corresponding bit lines, respectively, in the conducting state, to thereby pre-charge the respective corresponding bit lines to a power supply voltage VDD level.

The sense amplifier circuit 5 includes latch type sense amplifiers SAP provided for the bit line pairs, respectively. More specifically, in FIG. 3, the latch type sense amplifier SAP0 is provided for the bit lines BL00, BL01, and the latch type sense amplifier SAP1 is provided for the bit lines BL10, and BL11. The latch type sense amplifiers SAP0, SAP1 are each activated upon activation of a column select signal CSL for a corresponding column, and a sense amplifier activation signal SE, thereby executing differential amplification of potentials of the bit lines of the bit line pair corresponding to each of the latch type sense amplifiers before latching. For the latch type sense amplifiers SAP0, SAP1, respectively, it is possible to utilize, for example, a configuration of a cross-coupling P-channel MOS transistor, and a cross-coupling n-channel MOS transistor. Use of a differential type sense amplifier enables quick readout to be achieved as with the case of a ROM of a high-speed specification. Further, instead of disposing the sense amplifier in respective columns as with the case of an SRAM, use may be made of a configuration where the sense amplifier is disposed in a data line, thereby detecting data of a memory cell in a select column via a column select gate.

The source line drive circuit 4 includes a source line driver SDV0 for driving a source line SL0 into the select state according to the column select signal CSL. The source line driver SDV0 is made up of, for example, an inverter buffer, and when the column select signal CSL is held at the H-level of the select state, the source line driver SDV0 drives the source line SL0 corresponding thereto to the L-level of the select state. Further, when the column select signal CSL is at the L-level of the unselect state, the source line SL0 is held at the H-level (the power supply voltage VDD level).

A source line SL is provided so as to be shared by bit lines forming different bit line pairs, respectively, and is disposed so as to be continuously extended in the column direction. In FIG. 3, there is provided the source line SL0 in common with columns adjacent to the memory cells connected to the bit lines BL01, BL10, respectively.

The column selection circuit 6 is provided so as to correspond to the latch type sense amplifiers SAP0, SAP1, respectively, including column select gates CSG0, CSG1 that are turned into the conducting state according to the column select signal CSL, respectively. The column select gate CSG0 in the conducting state couples the latch type sense amplifier SAP0 to complementary bus lines RD00, RD01 of an internal read data bus RB0. The column select gate CSG1 in the conducting state couples the latch type sense amplifier SAP1 to complementary bus lines RD10, RD11 of an internal read data bus RB1.

In the configuration shown in FIG. 3, two pairs of the bit lines are selected in parallel by the agency of one column select signal CSL, thereby reading 2-bit data of the memory cell. Either the bit line BL00, or the bit line BL01 is used as the reference bit line, and either the bit line BL10 or the bit line BL11 is used as the reference bit line. The dummy cell DMC previously described is coupled to the reference bit line (the dummy cell DMC is provided for the respective bit lines as described in detail later on).

Figure 4:
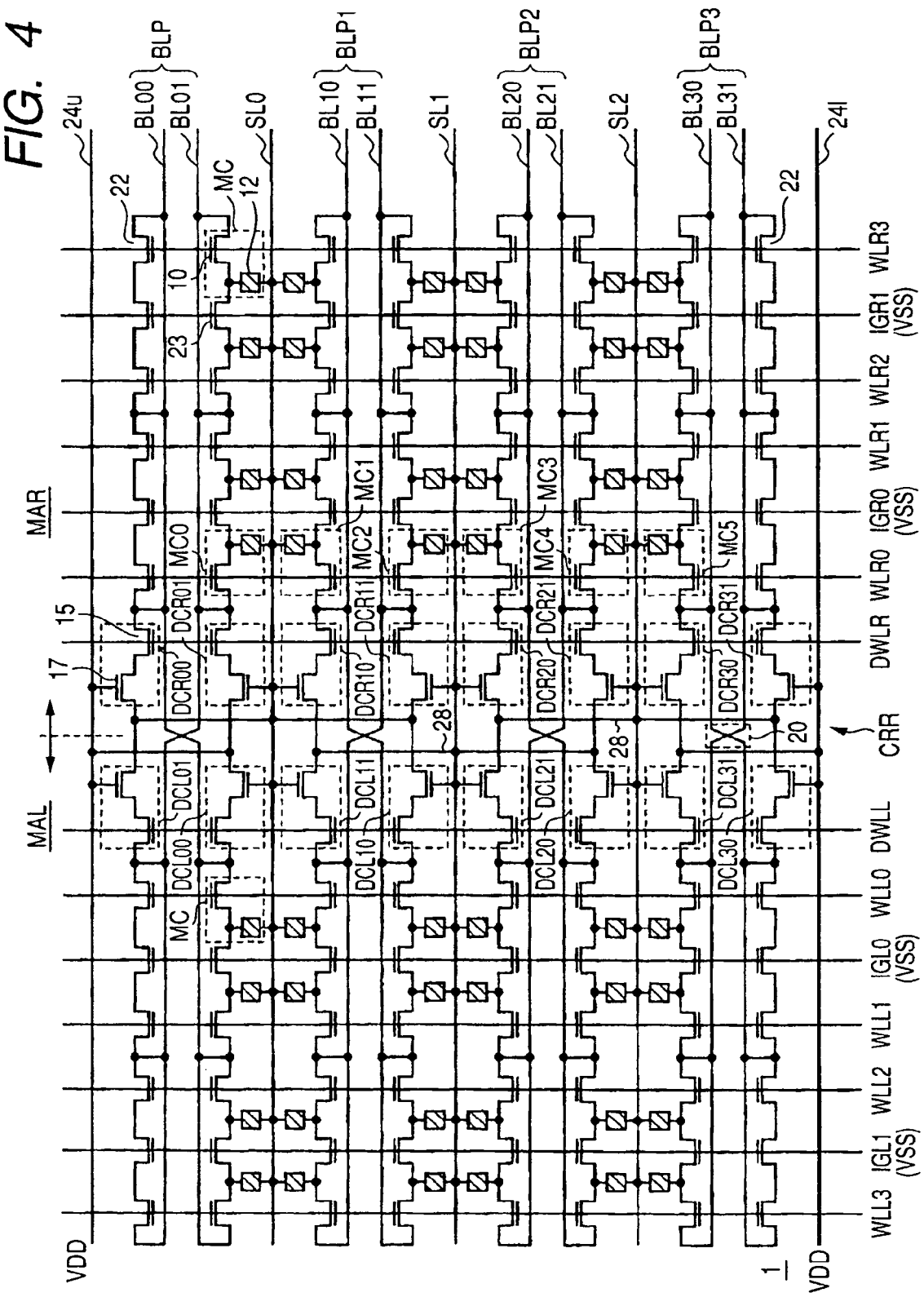
FIG. 4 is a view showing in greater details a configuration of a memory cell array shown in FIG. 1.

FIG. 4 is a view showing in greater details the configuration of the memory cell array 1 shown in FIG. 1. In FIG. 4, the memory cell array 1 includes the memory cells MC arranged in the matrix fashion, and the dummy cells DMC (DCR, DCL) disposed so as to correspond to the respective columns of the memory cells MC, and to be lined up in the row direction.

The memory cells MC each include the cell select transistor 10 and the data storage 12, and the dummy cells DMC each include, for example, the first and second switching transistors 15, 17, connected in series with each other.

The bit lines BL00, BL01, BL10, BL11, BL20, BL21, BL30 and BL31, corresponding to the respective columns of the memory cells MC, are laid out so as to be extended in the column direction. The bit lines BL00, BL01 form a bit line pair BLP0, the bit lines BL10, BL11 form a bit line pair BLP1. The bit lines BL20, BL21 form a bit line pair BLP2, and the bit lines BL30, BL31 form a bit line pair BLP3.

The memory cells and the dummy cells, lined up in one column, are connected to the respective bit lines. The source lines SL0, SL1, and SL2 each are laid out in the column direction in such a way as to be shared by the memory cells as well as the dummy cells, in columns adjacent to each other, respectively. The source line SL0 is shared by the memory cells connected to the bit lines BL01, BL10, respectively, the source line SL1 is shared by the memory cells connected to the bit lines BL11, BL20, respectively, and the source line SL2 is shared by the memory cells connected to the bit lines BL21, BL30, respectively.

The memory cell array 1 is divided into memory blocks MAR, MAL by a crossover-region CRR. In the crossover-region CRR, the bit line pairs BLP0 to BLP3 are each provided with an intersection 20 where respective positions of the bit lines are interchanged with each other. The intersection 20 for each of the bit line pairs BLP0 to BLP3, in the crossover-region CRR, is capable of reducing coupling capacitance existing between the bit line and the source line that are extended in the column direction, and laid out in parallel with each other, and generating common mode noise at the respective bit line pairs, thereby offsetting capacitive coupling noise.

For example, as the source line SL0 is adjacent to the bit lines BL01, and BL00, in the memory blocks MAR, MAL, respectively, coupling capacitance between the source line SL0 and the bit lines BL00 is rendered equal to that between the source line SL0 and the bit lines BL01. For example, even if the source line SL0 is driven into the select state, and a potential change occurs thereto, common mode capacitive coupling noise is transmitted to the bit lines BL00, BL01, respectively. Because the respective potentials of the bit lines BL00, BL01 are subjected to the differential amplification by each of the latch type sense amplifiers SAP as previously shown in FIG. 3, common mode noise is offset, so that stable readout of data can be attempted without being affected by the capacitive coupling noise. Further, the coupling capacitance existing between the bit line and the source line can be reduced to substantially ½ of that for the case where the bit lines are not provided with the intersection, thereby reducing the capacitive coupling noise.

Shape-dummy transistors 22 for maintaining regularity of the layout of a memory cell array pattern are normally connected to the bit line BL00, and the bit line with the shape-dummy transistors 22 connected thereto is also utilized as the reference bit line.

The memory cell MC is repeatedly laid out in the column direction in a manner where two memory cells are sandwiched between bit line contacts so as to share each of the bit line contacts. The memory cell MC includes the cell select transistor 10, and the data storage 12, as previously shown in FIG. 2, and the word lines WL are provided in such a way as to correspond to the respective rows of the memory cell. In FIG. 4, the word lines WLR0, WLR1, WLR2, and WLR3 are laid out in the memory block MAR, and the word lines WLL0, WLL1, WLL2, and WLL3 are laid out in the memory block MAL.

Isolation gates 23 are disposed in the column direction such that the memory cells continuously connected between the bit line contacts adjacent to each other in the column direction is isolated from each other by each of the isolation gates 23. The isolation gate 23 is made up of the n-channel MOS transistor as with the case of the cell select transistor 10 of the memory cell. As two units of the memory cells are disposed between the adjacent bit line contacts, in the column direction, and such placement of the memory cells is repeated in the column direction, the isolation gate 23 is disposed at intervals of two units of the cell select transistors 10, in the column direction.

A cell isolation gate line whose voltage level is fixed to a ground potential level is laid out in the respective rows of the isolation gates 23. In FIG. 4, the cell isolation gate lines IGR0, IGR1 are laid out between the word lines WLR0, WLR1, and between the word lines WLR2, and WLR3, respectively, in the memory block MAR. Further, in the memory block MAL as well, the cell isolation gate line IGL0 is laid out between the word lines WLL0, WLL1, and the cell isolation gate line IGL1 is laid out between WLL2, and WLL3. The cell isolation gate lines IGR, IGL each have a voltage level fixed at a ground voltage VSS level, thereby normally keeping the isolation gates 23 OFF. With the use of the isolation gates, the word lines, and the cell isolation gate lines can be disposed at equal pitches in the column direction, so that the memory cells can be disposed at a high density by making use of the 1-cell/bit configuration for storing 1-bit data in one memory cell.

The dummy cells are disposed in the respective columns on the respective sides of the crossover-region CRR, and the dummy cells DCRi0, DCRi1, . . . (i=0 to 3) are disposed so as to be lined up in the row direction in the memory block MAR while in the memory block MAL, the dummy cells DCLi1, DCLi0, . . . (i=0 to 3) are disposed so as to be lined up in the row direction. The dummy cells DCRi0, DCLi0 are connected to the bit line BLi0, and the dummy cells DCRi1, DCLi1 are connected to the bit line BLi1.

The dummy cells each include the first switching transistor 15 and the second switching transistor 17, and the dummy word line for common use is connected to respective control gates of the first switching transistors 15 of the dummy cells lined up in the row direction. The dummy word line DWLR is provided in the memory block MAR, and in the memory block MAL, the dummy word line DWLL is provided so as to be shared by the dummy cells DCLi1, DCLi0.

The second switching transistor 17 of each of the dummy cells has a source node coupled to the source line in an adjacent column via a source interconnection 28. Connection between the source node of the second switching transistor 17 of each of the dummy cells, and the source line is made on the source line to which the memory cells connected to the bit line pairing off with the bit line to which the dummy cells are connected. One source line is coupled to the respective source nodes of the second switching transistors 17 of the dummy cells disposed in two columns, adjacent to each other in the row direction. That is, the respective source nodes of the second switching transistors 17 of the dummy cells are connected to the source lines (SL0, SL1) for the columns of the memory cells connected to the bit lines (BL10, BL21), respectively, serving as the reference bit lines for the bit lines (for example, BL11, BL26) to which respective columns of the memory cells sharing the source line SL are connected. In the dummy cell, conduction of the second switching transistor 17 is controlled by the agency of a potential of the source line in a column corresponding thereto, and in the conducting state, a potential of an adjacent source line is transmitted to the bit line corresponding thereto, thereby enabling the bit line of the bit line pair, in an unselect column, to be used as the reference bit line. Particularly, by connecting the source line connected to the source node of the second switching transistor 17 with the source line provided for the bit line pairing off with the bit line in a corresponding column, the reference bit line can be formed for the bit line in a select column simply by driving the source line in a select column.

For the dummy cells DCR00, DCR01, making use of the shape-dummy transistors 22, a power supply line 24*u* for delivering the power supply voltage VDD is provided as a source line, and similarly, for the dummy cells DCR30, DCR31, making use of shape-dummy transistors 22 shown in the lower part of the figure, a power supply line 24*l* for delivering the power supply voltage VDD is provided as a source line. By so doing, the bit line pairs can be disposed by making efficient use of the memory cells disposed in the memory cell array, and an increase in area of the memory cell array is restrained to thereby implement differential readout of data.

Figure 5:
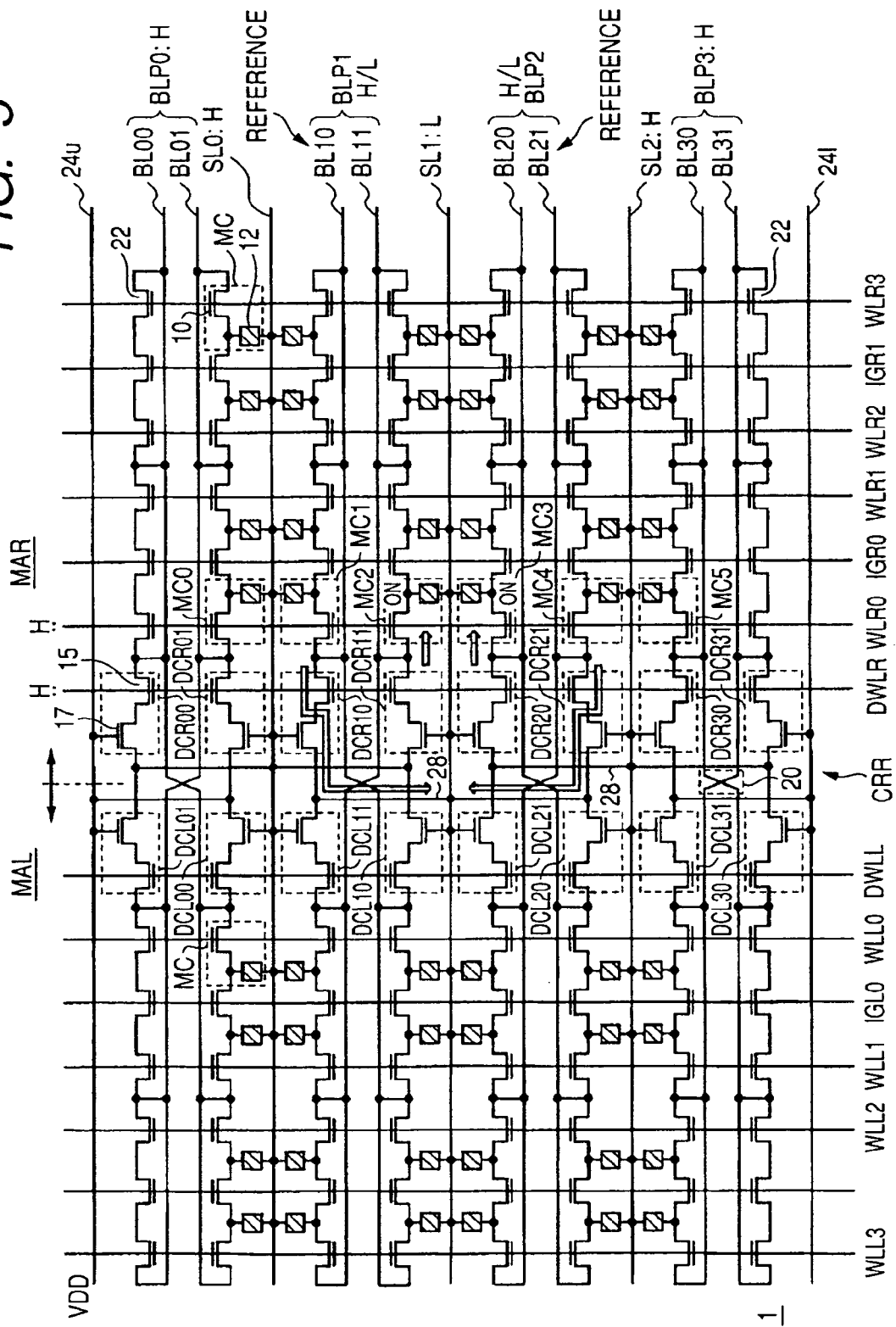
FIG. 5 is a schematic diagram showing potentials of respective signal lines, and current flow paths, inside the array, at the time of reading data of the nonvolatile semiconductor memory according to Embodiment 1.

FIG. 5 is a schematic diagram showing respective potentials of signal lines, and current flow, at the time of reading data of the nonvolatile semiconductor memory according to Embodiment 1 of the invention. In FIG. 5, there are shown the potentials of the signal lines, and current flow by way of example in the case where a source line SL1 is selected, and data is read out to bit line pairs BLP1, and BLP2, respectively. Further, a memory cell is addressed in a memory block MAR, and a dummy word line DWLR, and a word line WLR0 are selected.

Under this condition, the dummy word line DWLR and word line WLR0 are driven to the H-level (for example, the power supply voltage VDD level), and respective cell select transistors (10) of memory cells MC0 to MC5 connected to the word line WLR0 are turned into the ON state. Further, the source line SL1 in a select column is driven to the L-level, and source lines SL0, SL2 are kept at the H-level. The respective bit lines of the bit line pairs BLP0 to BLP3 have been precharged to the H-level. Accordingly, when the word line WLR0 is driven into the select state, even if the cell select transistor (10) of the memory cell MC0 is turned ON, and a data storage (12) is in the electrically conducting state, both the bit line BL01 and the source line SL0 are at the H-level, and the cell select transistor (10) of the memory cell MC0 is in the nonconducting state, so that no current flows to the bit line BL01.

Similarly, in a dummy cell DCR01, even if a first switching transistor (15) thereof is turned ON by the dummy word line DWLR, and a second switching transistor (17) thereof is turned ON according to a potential of the source line SL0 unselected, the source of the second switching transistor (17) of the dummy cell DCR01 is connected to a power supply line 24*u*, so that no current flows to the dummy cell DCR01, either. In consequence, potential change hardly occurs to the bit line BL01.

Similarly, in a dummy cell DCR00 as well, a second switching transistor 17 thereof is connected to the source line SL0, and even if a first switching transistor thereof 15, and the second switching transistor 17 are turned ON, no current flows to a bit line BL00, so that the bit line BL00 is kept in a pre-charge state. Similarly, no potential change occurs to the bit lines BL30, BL31 of the bit line pair BLP3 corresponding to an unselect column, so that the bit lines BL30, BL31 are kept in the pre-charge state.

The source line SL1 has been driven to the L-level for the bit line pairs BLP1, BLP2, in respective select columns, and respective second switching transistors of dummy cells DCR11, DCR20 are in the OFF state, so that current paths via the dummy cells DCR11, DCR20, respectively, are blocked. Meanwhile, when a cell select transistor of a memory cell MC2 is turned ON, a potential level of a bit line BL11 is decided according to a condition of a data storage (12) of the memory cell MC2. Similarly, in a memory cell MC3, a potential level of the bit line BL20 is decided according to a condition of a data storage (12) of the memory cell MC3.

With a dummy cell DCL10 in an adjacent column unselected, the source line SL0 is at the H-level, and first and second switching transistors thereof (15, 17) are turned into the ON state, whereupon the bit line BL10 causes a current to flow to the source line SL1 (at the L-level) via the dummy cell DCL10, so that a potential level of the bit line BL10 becomes lower. With a dummy cell DCR21 as well, the source line SL2 is similarly at the H-level, and a current flows from the bit line BP21 to the source line SL1, so that a potential level of the bit line BL21 becomes lower. By determining respective potential levels of the bit lines BL11, BL20 with the use of the bit lines BL10, BL21, serving as the reference the bit line, respectively, it is possible to execute readout of respective data units of the memory cells connected to the bit lines BL11, BL21, respectively. Accordingly, selection of one source line enables 2-bit data to be read.

Figure 6:
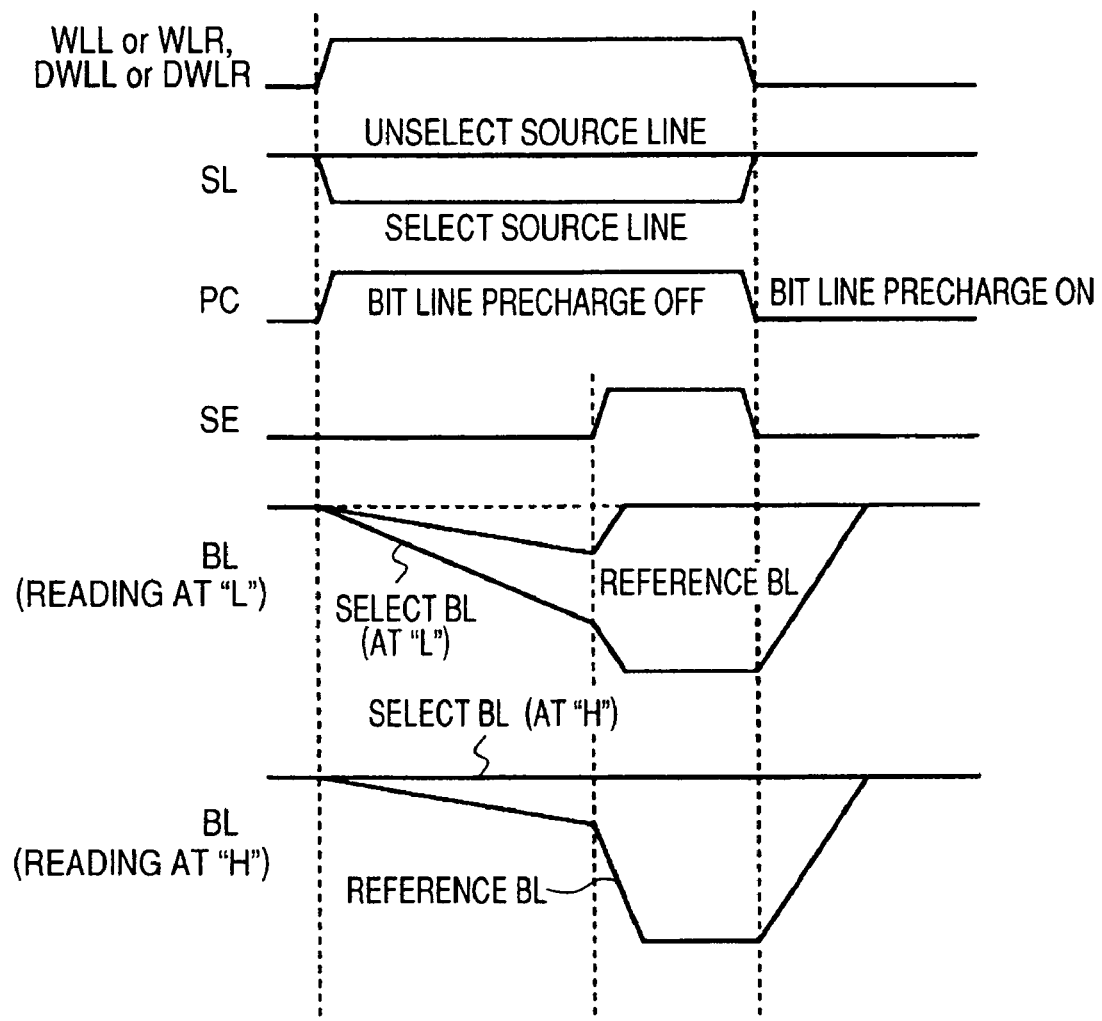
FIG. 6 is a waveform chart showing signal waveforms at the time of reading data under a condition of voltage applied as shown in FIG. 5.

That is, as shown in FIG. 6, at the time of reading data, the pre-charge indicator signal PC is deactivated to thereby complete pre-charging of the bit lines. Along with this, selection of a row and a column is executed according to an address signal (not shown) to thereby drive the word line WL (WLL or WLR), and the dummy word line DWL (DWLL or DWLR) to the select state, and the source line in a select column is driven to the ground voltage level.

With the memory cells (MC2, MC3) connected to the bit lines (BL11, BL20) as selected, respectively, in the case where the data storage is in the electrically conducting state, discharging from the bit lines to the source lines via the respective cell select transistors of the memory cells is effected. With the reference bit lines (BL10, BL21), discharging of the reference bit lines via the dummy cells, respectively, is effected. In this case, with the memory cell as selected, discharging is effected via one unit of the cell select transistor while with the dummy cell, discharging is effected via the series-circuit made up of the first and second switching transistors. Accordingly, a potential drop speed of the reference bit line is lower than a discharge speed at which the data storage is discharged through the memory cell in the electrically conducting state, so that there occurs a potential difference between the reference bit line, and the bit line as selected.

On the other hand, in the case where the data storage of the memory cell as selected is in the electrical cutoff state, discharging through the memory cell as selected is not effected, and the bit line as selected is kept in the pre-charge state while the reference bit line corresponding thereto is discharged via the dummy cell. In a state where the potential difference between the bit line as selected and the reference bit line is sufficiently increased, the sense amplifier activation signal SE is activated, and the potentials of the bit lines of the bit line pair are subjected to differential amplification to be then latched, whereupon complementary data is latched to the bit lines of the bit line pair, respectively.

Upon completion of a cycle of data readout, the sense amplifier activation signal SE is deactivated, and the pre-charge indicator signal PC is turned into the activated state at the L-level, whereupon the respective bit lines are precharged back to the power supply voltage VDD level, and the source lines SL are driven back to the H-level. Similarly, the word lines WLL, and the dummy word line DWLR as selected are driven to the unselect state. By so doing, one cycle of data readout is completed.

In the case where the data storage of the memory cell MC1 in the unselect column is in the electrically conducting state when the potential level of the bit line BL10 becomes lower due to discharging of the dummy cell DCL10, it is conceivable that the cell select transistor is turned into the conducting state, and a current flows from the source line SL0 at the H-level to the bit line BL10. However, as previously described, with the memory cell MC1, for example, the substrate region thereof is mutually connected with the source region thereof, the source region is thereby kept fixed, and a source node potential of the memory cell MC1 in the unselect column is turned to the H-level, which is the same potential level as a gate potential level thereof, so that the cell select transistor (10) of the memory cell MC1 is kept in the nonconducting state. Accordingly, the potential level of the reference bit line BL10 is reliably lowered at an intermediate speed against a discharge speed of the memory cell according to the dummy cell DCL10.

In the foregoing description, it has been described that the data storage 12 is made up of one interconnection, and is set to be in the electrically conducting state/the electrical cutoff state. However, in the case where the data storage is made up of, for example, a PN diode, and connection between the PN diode and the source line is selectively formed, a direction of current flow is decided by the PN diode at all times while in the case where the source line unselected is kept at the H-level, no current flows via the PN diode, so that there is no need for taking into consideration polarity with respect to the source/drain region of the cell select transistor.

As described in the foregoing, with adoption of the 1-cell/bit configuration for storing 1-bit data in one memory cell, it is possible to utilize the same array configuration as that for the ROM of the high-density specification, thereby implementing a high density layout of the memory cells. Further, the readout of data is executed by the differential amplification of the potentials of the bit lines of the bit line pair, thereby enabling quick readout to be effected. Thus, as with the case of the ROM of the 2-cells/bit configuration, quick readout can be achieved, thereby implementing a ROM at a high-density, and accessible at high-speed.

While the dummy bit line with the shape-dummy transistors connected thereto is used as the reference bit line, the bit lines with ordinary memory cells connected thereto are also used as the reference bit line, so that there is no need for newly installing reference bit lines for exclusive use in generating the reference potential, thereby enabling an increase in layout area of the memory array to be checked.

Further, with the configuration described as above, the memory cell array is provided with one unit of the crossover-region CRR. However, the crossover-regions may be provided in the memory cell array as adopted in the case of a twist bit line structure of a DRAM (Dynamic Access Memory). The dummy word lines, and the word lines are selected in parallel with each other in regions divided by the respective crossover-regions.

Further, in the foregoing description, the readout of data in the memory block MAR has been discussed, however, readout of data can be similarly executed in the memory block MAL as well by driving the dummy word line DWLL, and any of the word lines WLL0 to WLL3 into the select state.

With in the foregoing description, the bit lines of the bit line pair, in two columns, are selected by the agency of one column select signal, thereby reading 2-bit data, however, by selecting in parallel the source lines adjacent to each other with one source line interposed therebetween, (for example, SL0, and SL2), it is also possible to read 4-bit data.

Further, the intersection is provided at each of the bit line pairs, however, the intersection may be provided at the source lines SL according to respective internal layouts of the cells. A potential change occurs to the source line as selected, and it will be sufficient if capacitive coupling noise due to the potential change occurring to the source line as selected is reduced at the respective bit lines of the bit line pairs. For example, the source lines adjacent to each other, as a pair, may be provided with the intersection. Furthermore, both the bit line pairs, and the source lines may be provided with the intersection, respectively.

The isolation gate transistor 23 between the cell select transistors is kept in the nonconducting state at all times with the use of the cell isolation gate lines IGR, IGL, respectively, thereby implementing cell isolation. However, the cell select transistors may be isolated from each other by adoption of an insulating film isolation configuration such as STI (Shallow Trench Isolation) in place of the isolation gate transistor 23. Two units of the cell select transistors are repeatedly disposed in the column direction on the basis of every two memory cells in such a way as to share the bit line contact. Further, an isolation region may alternatively be provided on a memory-cell-by-memory-cell basis to thereby implement cell isolation by use of an insulating film.

By applying the nonvolatile semiconductor memory according to the invention to a mask ROM wherein stored data is fixedly programmable by wiring, it is possible to implement a high-speed and high-density mask ROM, and in particular, if the nonvolatile semiconductor memory is put to application where a ROM of the high-speed specification, such as a system-on-chip type ROM with a microprocessor built therein, is employed, this will enable a high-speed ROM with a small occupied area to be implemented, thereby enabling a system scale and cost to be reduced.

What is claimed is:

1. A nonvolatile semiconductor memory comprising:
   a plurality of memory cells arranged in a matrix fashion, the respective memory cells including a cell select transistor and a data storage, connected in series with each other;
   a plurality of bit lines disposed so as to correspond to respective columns of the memory cells, the respective bit lines being connected to the memory cells in columns corresponding thereto, and being laid out such that the respective bit lines in columns adjacent to each other form a bit line pair;
   a plurality of source lines disposed so as to correspond to the respective columns of the memory cells such that the respective source lines are shared by the memory cells in columns adjacent to each other, the respective columns of the memory cells, sharing the respective source lines, being connected to the respective bit lines of the individual bit line pairs;
   a plurality of word lines disposed so as to correspond to respective rows of the memory cells, the respective word lines being connected to the respective cell select transistors of the memory cells in rows corresponding thereto, wherein at the time of selection of the word line, a current is caused to selectively flow between the bit line and the source line, corresponding thereto, in the respective memory cells connected to the word line as selected, according to stored data in the data storage;
   at least one dummy word line laid out so as to be in parallel with the word lines;

a plurality of dummy cells disposed so as to correspond to the at least one dummy word line and the respective bit lines, wherein the respective dummy cells include at least a first switching transistor and a second switching transistor connected in series with each other, the first switching transistor is turned into a conducting state at the time of selection of the dummy word line corresponding thereto while the second switching transistor is turned into the conducting state at the time of nonselection of the source line in a column corresponding thereto or at all times, thereby forming a path through which a current flows between the source line adjacent to the source line corresponding thereto and the bit line corresponding thereto when both the first and second switching transistors are in the conducting state.

2. The nonvolatile semiconductor memory according to claim 1, wherein at least either the respective bit line pairs or respective pairs of the source lines adjacent to each other are provided with at least one intersection, wherein the at least one dummy word line includes the dummy word line disposed on respective sides of the intersection, and wherein the dummy word line and the word line, disposed on the same side of the intersection, are selected in parallel with each other.

3. The nonvolatile semiconductor memory according to claim 1, further comprising a source line drive circuit for driving the source line in a select column into a select state, and a bit line pre-charge circuit for pre-charging the respective bit lines to a level of a potential differing from a potential of the source line in the select state.

4. The nonvolatile semiconductor memory according to claim 1, further comprising a plurality of sense amplifiers for differentially amplifying a potential of the bit line pair in a select column.

5. The nonvolatile semiconductor memory according to claim 1, further comprising:

a plurality of shape-dummy cells disposed so as to be lined up in the column direction, and along the memory cells in the row direction, the respective shape-dummy cells including a third switching transistor corresponding to the cell select transistor, and shape-dummy bit lines with the shape-dummy cells connected thereto, each of the shape-dummy bit lines being disposed so as to form a pair with the bit line in a column adjacent thereto, wherein the third switching transistor of the dummy cell disposed so as to correspond to the respective shape-dummy bit line is provided with a voltage line serving as a source line for delivering a voltage for keeping the third switching transistor in the conducting state at all times.

6. The nonvolatile semiconductor memory according to claim 1, wherein the memory cells are laid out such that the memory cells adjacent to each other in the column direction are disposed so as to share a bit line contact, and an isolation element kept in the nonconducting state at all times is disposed between the memory cells disposed between the bit line contacts adjacent to each other in the column direction.

7. The nonvolatile semiconductor memory according to claim 6, wherein the isolation elements are each provided with a transistor having a gate with a fixed potential delivered thereto, and the transistors of the isolation elements, lined up in a row direction, are coupled to a common cell isolation gate line laid out so as to be in parallel with the word lines.

8. The nonvolatile semiconductor memory according to claim 1, wherein the second switching transistor of each of the dummy cells has a gate electrode coupled to the source line in a column corresponding thereto, and the first and second switching transistors are connected in series with each other between the bit line corresponding thereto and the source line in a column adjacent thereto.

9. The nonvolatile semiconductor memory according to claim 2, wherein the intersection is provided at the respective bit line pairs.

* * * * *